United States Patent
Wu et al.

(10) Patent No.: US 7,015,112 B2
(45) Date of Patent: Mar. 21, 2006

(54) METHOD OF FORMING BOTTOM OXIDE LAYER IN TRENCH STRUCTURE

(75) Inventors: Ta-Chung Wu, Hsinchu (TW);
Yi-Chuan Yang, Hsinchu (TW);
Shih-Chi Lai, Hsinchu (TW);
Yew-Jung Chang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/668,454

(22) Filed: Sep. 22, 2003

(65) Prior Publication Data

US 2004/0152271 A1    Aug. 5, 2004

(30) Foreign Application Priority Data

Jan. 30, 2003   (TW) ............................. 92102261 U

(51) Int. Cl.
*H01L 21/76* (2006.01)
(52) U.S. Cl. ..................................... 438/424
(58) Field of Classification Search ............... 438/269, 438/270, 424, 633, 689, 691, 692, 425, 426
See application file for complete search history.

(56) References Cited

U.S. PATENT DOCUMENTS

| 6,265,269 | B1 |   | 7/2001  | Chen et al. |
| 6,566,228 | B1 | * | 5/2003  | Beintner et al. ............ 438/430 |
| 6,596,607 | B1 | * | 7/2003  | Ahn ........................... 438/424 |
| 6,638,815 | B1 | * | 10/2003 | Bronner et al. ............. 438/246 |
| 6,723,658 | B1 | * | 4/2004  | Eissa et al. ................. 438/745 |
| 2001/0031540 | A1 | * | 10/2001 | Lim et al. ................... 438/424 |
| 2002/0081817 | A1 | * | 6/2002  | Bhakta et al. .............. 438/424 |

* cited by examiner

*Primary Examiner*—W. David Coleman
*Assistant Examiner*—Khiem Nguyen
(74) *Attorney, Agent, or Firm*—Townsend and Townsend and Crew LLP

(57) ABSTRACT

Embodiments of the invention are directed to a method of forming a bottom oxide in a trench structure. In one embodiment, the method includes steps of providing a semiconductor substrate and forming a trench structure in the semiconductor substrate; performing an PECVD process with TEOS as a source to deposit an oxide layer on the bottom and sidewall of the trench structure and the semiconductor substrate; and removing the oxide layer on the sidewall of the trench structure substantially completely and the oxide layer on the bottom of the trench structure partially to define the remained oxide layer as the bottom oxide layer.

25 Claims, 6 Drawing Sheets

METHOD OF FORMING BOTTOM OXIDE LAYER IN TRENCH STRUCTURE

CROSS-REFERENCES TO RELATED APPLICATIONS

This application claims priority from R.O.C. Patent Application No. 092102261, filed Jan. 30, 2003, the entire disclosure of which is incorporated herein by reference.

BACKGROUND OF THE INVENTION

The present invention relates to a method of forming a bottom oxide layer, and more particularly to a method of forming a bottom oxide layer in a trench structure of a trench-type power Metal Oxide Semiconductor Field Effect Transistor (MOSFET) device.

Nowadays, trench-type power MOSFET devices are widely used in the semiconductor industry. During the manufacturing process for forming a trench-type power MOSFET, a bottom oxide layer is usually formed in a trench structure of a power MOSFET device to be served as a dielectric layer. For example, a conventional process for forming a bottom oxide layer in a trench structure of a trench-type power MOSFET device is described as follow. FIGS. 1(a) to 1(c) are schematic cross-sectional views illustrating a conventional process for forming a bottom oxide layer in a trench structure of a trench-type power MOSFET device. As shown in FIG. 1(a), a pad oxide layer 11 and a silicon nitride layer 12 are sequentially formed on a semiconductor substrate 1. Then, the silicon nitride layer 12, the pad oxide layer 11, and the semiconductor substrate 1 are partially removed to form at least one trench structure 13 by the photolithography and etching process. Thereafter, as shown in FIG. 1(b), a silicon oxide layer 14 is formed on the silicon nitride layer 12 and on the bottom and sidewall of the trench structure 13 by the High Density Plasma Chemical Vapor Deposition (HDP-CVD) process. The thickness of the silicon oxide layer 14 formed by the HDP-CVD process is almost the same both on the bottom and sidewall. After the etching process is performed to remove the silicon oxide layer 14 on the sidewall of the trench structure 13, as shown in FIG. 1(c), only a portion of the silicon oxide layer 14 on the bottom of the trench structure 13 will remain and is defined as a bottom oxide layer 15.

However, the thickness of the bottom oxide layer typically is not enough after the above processes. In order to achieve the required thickness for the bottom oxide layer, the HDP-CVD process and the etching process need to be repeated again and again. Due to the high cost of the HDP-CVD process and the need for repeated processes, the conventional method requires substantial cost and time to form a bottom oxide layer.

Another method for fabricating a concave bottom oxide in a trench structure is disclosed in U.S. Pat. No. 6,265,269. The following is a summary of that method. First, as shown in FIG. 2(a), a semiconductor substrate 2 is provided, and a pad oxide layer 21 and a silicon nitride layer 22 are then sequentially formed on the semiconductor substrate 2. After that, the silicon nitride layer 22, the pad oxide layer 21, and the semiconductor substrate 2 are partially removed to form a trench structure 23 on the semiconductor substrate 2. Then, as shown in FIG. 2(b), a silicon oxide layer 24 is formed on the bottom and sidewall of the trench structure 23 and on the silicon nitride layer 22 by the Plasma Enhanced Chemical Vapor Deposition (PECVD) process, wherein the silicon oxide layer 24 has an overhang portion A at the corner of the trench structure 23. Subsequently, as shown in FIG. 2(c), an anisotropic etching process (i.e., the dry-etching process) is performed on the silicon oxide layer 24 to form a concave silicon oxide layer 24 in the trench structure 23 by using the overhang portion A as an etching mask to protect the silicon oxide layer 24 near the sidewall of the trench structure 23. Finally, as shown in FIG. 2(d), the wet-etching process is performed to remove the silicon oxide layer 24 on the sidewall of the trench structure 23 and on the silicon nitride layer 22 to form a bottom oxide layer 25 in the trench structure 23.

However, the anisotropic etching process and the wet-etching process both need to be used in the procedure of the above method, as shown in FIGS. 2(c)~(d), and render the above method more complicated. Therefore, it is desirable to develop a method of forming a bottom oxide layer in a trench structure at reduced cost and time.

BRIEF SUMMARY OF THE INVENTION

Embodiments of the present invention are directed to a method of forming a bottom oxide in a trench structure applied to a trench-type power MOSFET device. The method according to the present invention not only can save the cost and time, but can also simplify the procedure steps.

In accordance with an aspect of the present invention, a method of forming a bottom oxide layer in a trench structure is provided. The method includes steps of (a) providing a semiconductor substrate and forming a trench structure on the semiconductor substrate; (b) performing the plasma-enhanced chemical vapor deposition (PECVD) process with tetraethylorthosilicate (TEOS) as a gas source to deposit an oxide layer on the bottom and sidewall of the trench structure and the semiconductor substrate; and (c) removing the oxide layer on the sidewall of the trench structure substantially completely and the oxide layer on the bottom of the trench structure partially to define the remaining oxide layer as a bottom oxide layer.

In some embodiments, the step (a) further includes steps of: (a1) forming a pad oxide layer on the semiconductor substrate; (a2) forming a silicon nitride layer on the pad oxide layer; and (a3) removing the silicon nitride layer, the pad oxide layer and the semiconductor substrate partially to form a trench structure.

In specific embodiments, the step (a3) is performed by the photolithography and dry-etching process. The trench structure desirably has the aspect ratio between about 3.0 and about 4.0. The plasma-enhanced chemical vapor deposition (PECVD) process desirably is performed at a temperature of 440° C. to 520° C. The ratio of the thickness of the oxide layer deposited on the bottom of the trench structure to that on the sidewall of the trench structure is between about 1.5 and about 2.3. The step (c) may be performed by the wet-etching process. The etching selectivity of the oxide layer on the sidewall of the trench structure to that on the bottom of the trench structure is between about 2.5 and about 3. After the step (c), the steps of depositing and removing the oxide layer are repeated in sequence for allowing the bottom oxide layer to reach a required thickness. The oxide layer may be a silicon oxide layer.

In accordance with another aspect of the invention, a method of fabricating a trench-type power MOSFET comprises: (a) providing a semiconductor substrate and forming a trench structure on the semiconductor substrate; (b) performing the plasma-enhanced chemical vapor deposition (PECVD) process with tetraethylorthosilicate (TEOS) as a gas source to deposit an oxide layer on the bottom and sidewall of the trench structure and on the semiconductor substrate; (c) removing the oxide layer on the sidewall of the trench structure substantially completely and the oxide layer on the bottom of the trench structure partially to define the remaining oxide layer as a bottom oxide layer; and (d) forming a trench-type power MOSFET device in the trench structure.

In accordance with another aspect of the present invention, a method of forming a bottom oxide layer in a trench structure comprises providing a substrate having a trench having a bottom and a sidewall; depositing an oxide layer on the bottom and sidewall of the trench by plasma-enhanced chemical vapor deposition (PECVD) process with tetraethylorthosilicate (TEOS) as a gas source at a temperature of about 440° C. to about 520° C.; and removing the oxide layer on the sidewall of the trench substantially completely and the oxide layer on the bottom of the trench partially to form a remaining oxide layer as the bottom oxide layer on the bottom of the trench.

DETAILED DESCRIPTION OF THE INVENTION

Figure 1A:
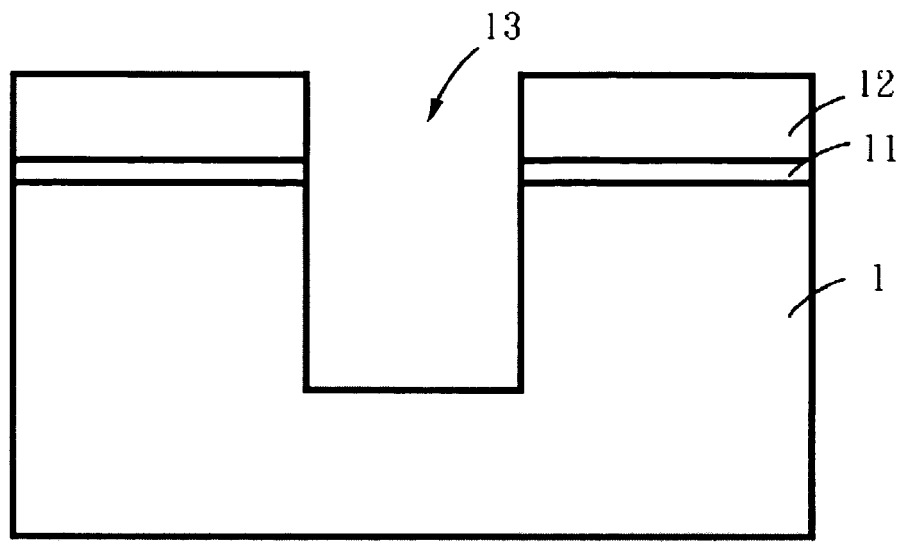
FIGS. 1(a) to 1(c) are schematic cross-sectional views illustrating a conventional process for forming a bottom oxide layer in a trench structure.
Figure 1B:
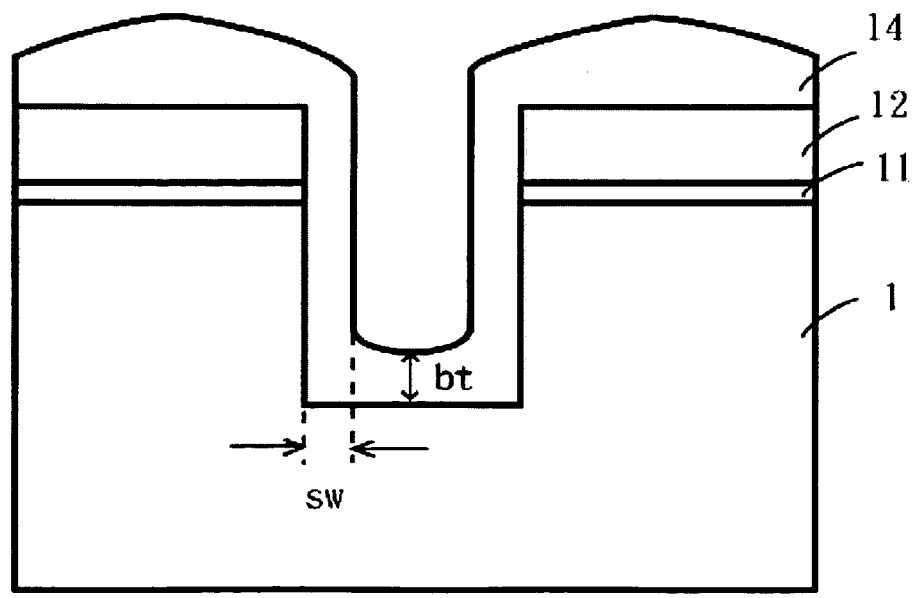
Figure 1C:
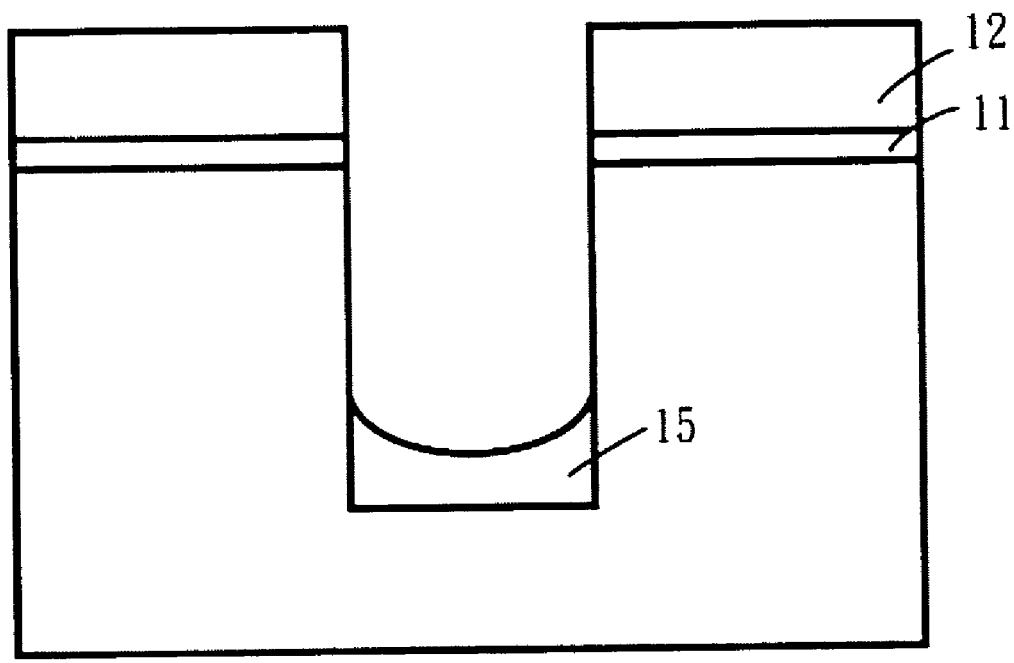
Figure 2A:
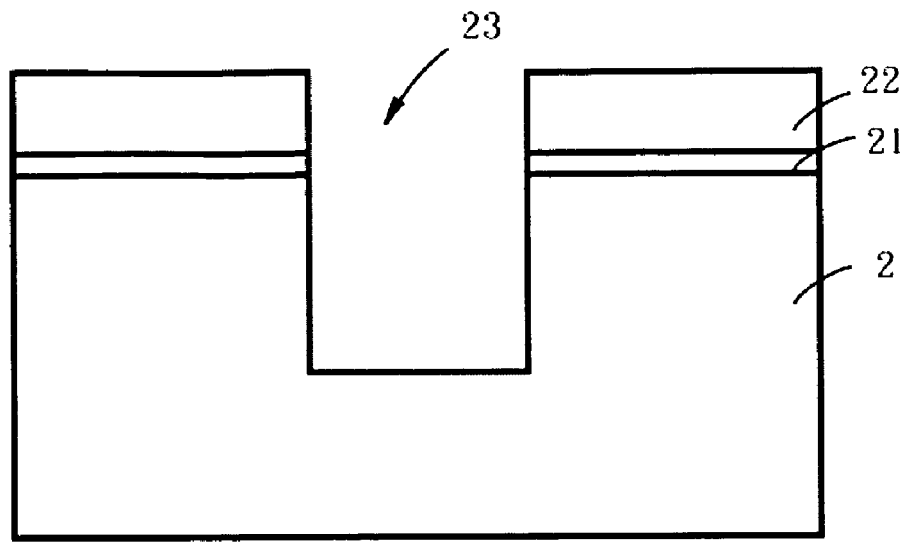
FIGS. 2(a) to 2(d) are schematic cross-sectional views illustrating another conventional process for forming a bottom oxide in a trench structure.
Figure 2B:
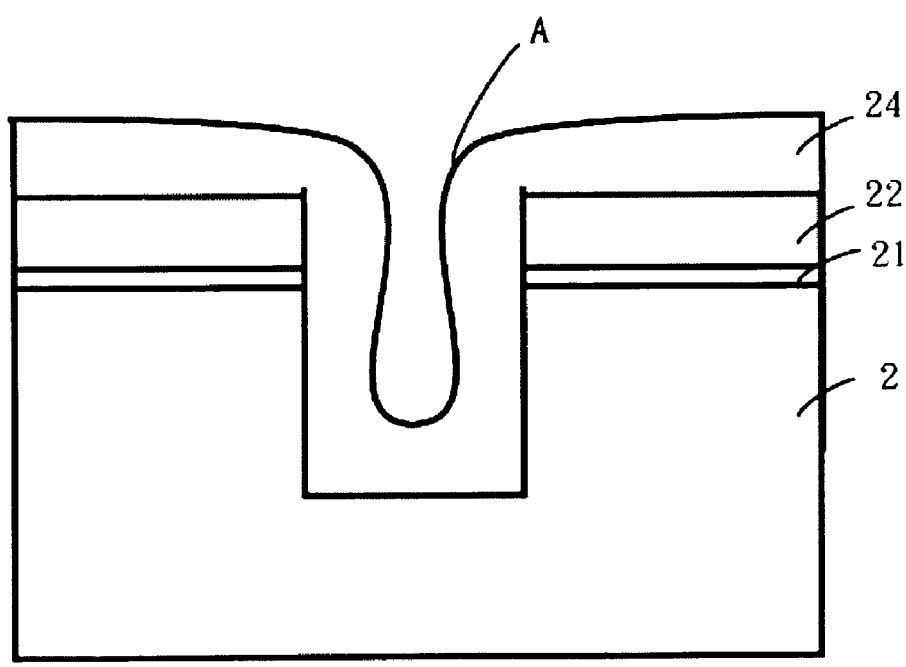
Figure 2C:
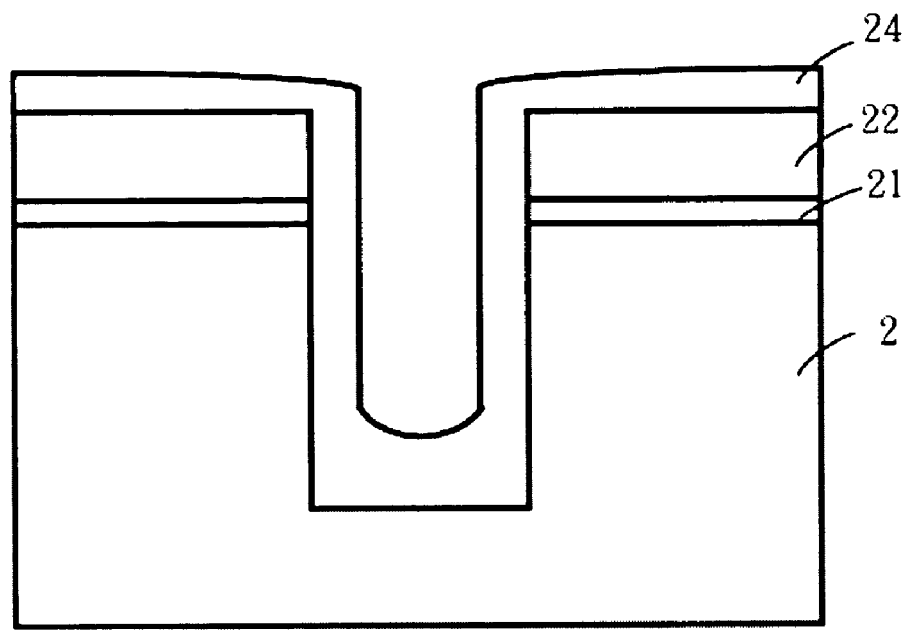
Figure 2D:
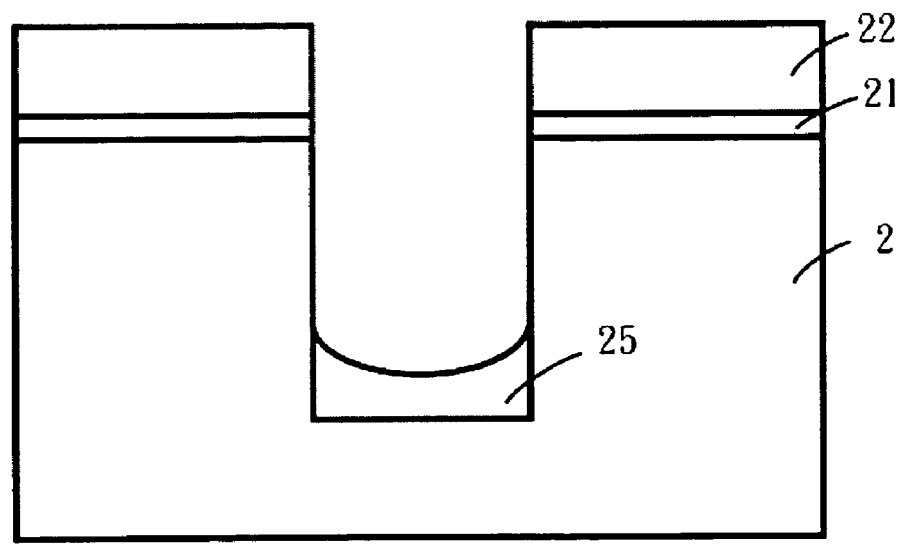
Figure 3A:
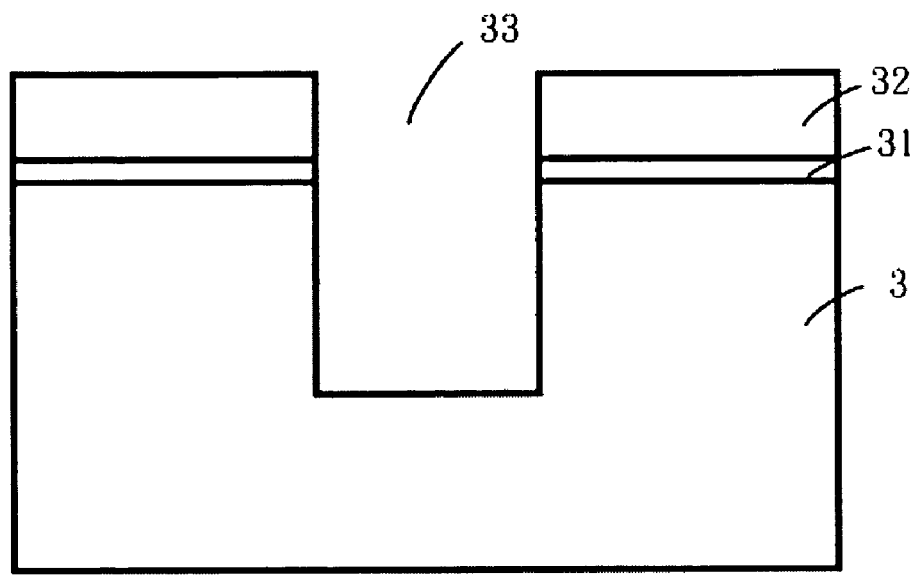
FIGS. 3(a) to 3(d) are schematic cross-sectional views illustrating an exemplary embodiment of a process for forming a bottom oxide in a trench structure according to the present invention.

Embodiments of the present invention are directed to a method of forming a bottom oxide layer in a trench structure of a trench-type MOSFET device. FIGS. 3(a) to 3(d) are schematic cross-sectional views illustrating an exemplary embodiment process for forming a bottom oxide in a trench structure according to the present invention. As shown in FIG. 3(a), a semiconductor substrate 3, typically a silicon substrate, is provided. Then, a pad oxide layer 31 and a silicon nitride layer 32 are sequentially formed on the semiconductor substrate 3. Subsequently, the silicon nitride layer 32, the pad oxide layer 31 and the semiconductor substrate 3 are partially removed to form a trench structure 33 on the semiconductor substrate 3, for example, using a conventional photolithography and dry-etching process. The trench structure 33 is formed with the aspect ratio of typically between about 3.0 and about 4.0.

Figure 3B:
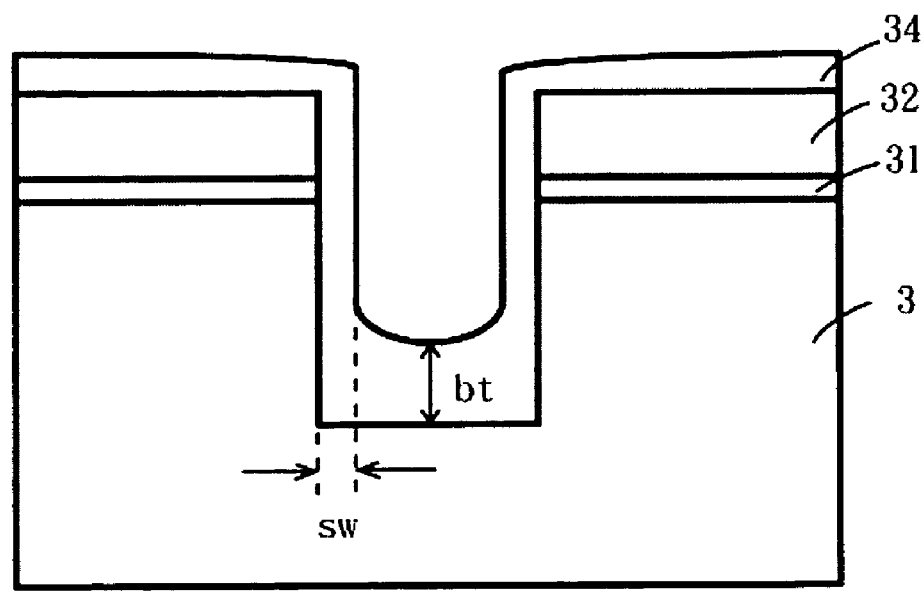

In FIG. 3(b), an oxide layer 34 is deposited on the bottom and the sidewall of the trench structure 33 and on the silicon nitride oxide layer 32. The oxide layer 34 may be formed by the plasma-enhanced chemical vapor deposition (PECVD) process with tetraethylorthosilicate (TEOS) as a gas source. By performing the PECVD-TEOS process at a temperature of about 440° C. to about 520° C., preferably about 440° C. to about 480° C., the reaction speed of the molecules of the TEOS will be increased so as to have a ratio of the thickness of the oxide layer 34 deposited on the bottom (bt) of the trench structure 33 to that on the sidewall (sw) of the trench structure 33 between about 1.5 and about 2.3.

Figure 3C:
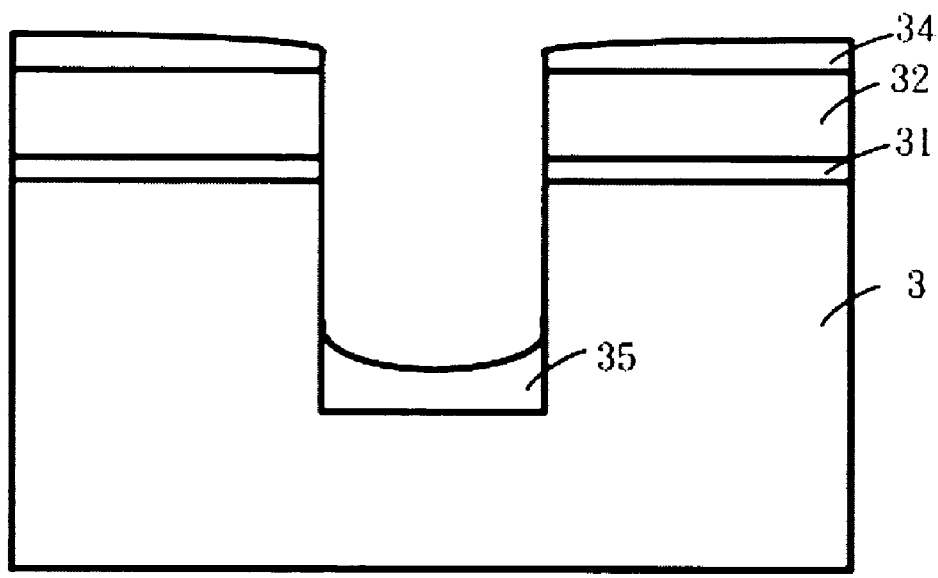

Thereafter, as shown in FIG. 3(c), the oxide layer 34 on the sidewall of the trench structure 33 is substantially completely removed and the oxide layer 34 on the bottom of the trench structure 33 is partially removed. The remaining oxide layer 34 on the bottom of the trench structure 33 is then defined as a bottom oxide layer 35. Usually, the bottom oxide layer 35 is used as a gate oxide layer of a trench-type MOSFET device. In this embodiment, the wet-etching process is performed to remove the oxide layer 34 on the sidewall of the trench structure 33 substantially completely and to leave the oxide layer 34 on the bottom of the trench structure 33 as much as possible. The wet-etching process is typically performed with a HF-based solution or a HF-based solution mixed with NHF solutes. Further, in the wet-etching process, the etching selectivity of the oxide layer 34 on the sidewall of the trench structure 33 to that on the bottom of the trench structure 33 is preferably between about 2.5 and about 3, thereby removing the oxide layer 34 on the sidewall of the trench structure 33 rapidly and leaving the oxide layer 34 on the bottom of the trench structure 33 as much as possible.

Figure 3D:
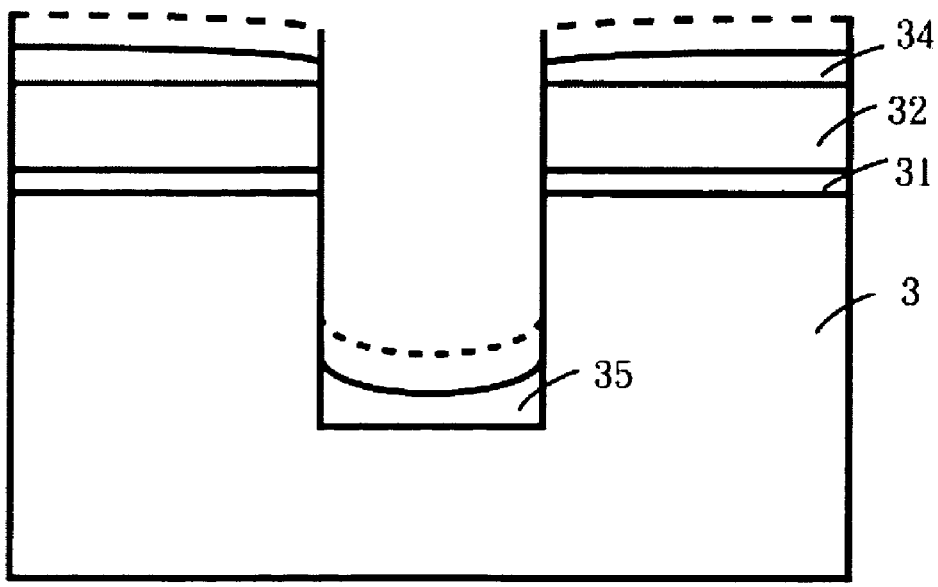

In addition, if the thickness of the bottom oxide layer 35 has not reached a required value after the above steps, as shown in FIG. 3(d), the deposition process and the etching process, i.e. the PECVD (plasma-enhanced chemical vapor deposition) process and the wet-etching process, are repeated until the bottom oxide layer 35 reaches the required thickness.

After the required thickness of the bottom oxide layer 35 on the trench structure 33 has been formed, subsequent processes are performed to form a trench-type power MOSFET in the trench structure 33.

To sum up, the present invention uses the PECVD-TEOS (i.e. plasma-enhanced chemical vapor deposition using TEOS as a gas source) process to form the oxide layer 34 at a temperature within a critical range of about 440° C. to about 520° C. Due to the high reaction temperature, TEOS molecules will be speeded up and the oxide layer 34 will be formed with a ratio of the thickness on the bottom of the trench structure 33 to that on the sidewall of the trench structure 33 between about 1.5 and about 2.3. Therefore, when the oxide layer 34 on the sidewall of the trench structure 33 is substantially completely removed, a portion of the oxide layer 34 on the bottom of the trench structure 33 will remain and is defined as a bottom oxide layer. Accordingly, the less the oxide layer 34 on the bottom of the trench structure 33 is removed, the soon the required thickness of the bottom oxide layer 35 in the trench structure 33 is reached. Thus, the deposition process and the etching process need not be repeated again and again as before, and the cost and time are decreased accordingly.

Especially for a trench structure with high aspect ratio, the present invention can more easily control the thickness of the oxide layer 34 formed in the trench structure 33 than other conventional processes. Further, the oxide layer 34 formed by the PECVD-TEOS process is free from the generation of any particle and has better electrical characteristics.

Moreover, by using a the wet-etching process with the high etching selectivity of the oxide layer on the sidewall of the trench structure 33 to that on the bottom of the trench structure 33, the oxide layer 34 on the sidewall of the trench structure 33 can also be removed substantially completely in a short time and a much greater portion of the oxide layer 34 remains on the bottom of the trench structure 33 than before when conventional processes are used. In addition, the conventional HDP-CVD process is limited by equipment and requires a higher cost. The methods according to embodiments of the present invention avoid these problems.

Therefore, the present invention not only saves cost and time, but also allows the thickness of the bottom oxide layer to be controlled more easily.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of forming a bottom oxide layer in a trench structure, the method comprising:
   (a) providing a semiconductor substrate and forming a trench structure on said semiconductor substrate;
   (b) performing a plasma-enhanced chemical vapor deposition (PECVD) process without bias sputtering, with tetraethylorthosilicate (TEOS) as a gas source at a temperature of about 440° C. to about 520° C. to deposit an oxide layer on the bottom and sidewall of said trench structure and said semiconductor substrate, the oxide layer only partially filling the trench; and
   (c) removing, using a single etching process, said oxide layer on the sidewall of said trench structure substantially completely and said oxide layer on the bottom of said trench structure partially to define a remaining oxide layer as the bottom oxide layer.

2. The method according to claim 1 wherein the step (a) further comprises:
   (a1) forming a pad oxide layer on the semiconductor substrate;
   (a2) forming a silicon nitride layer on said pad oxide layer; and
   (a3) removing said silicon nitride layer, said pad oxide layer and said semiconductor substrate partially to form said trench structure.

3. The method according to claim 2 wherein the step (a3) is performed by a photolithography and dry-etching process.

4. The method according to claim 1 wherein the trench structure has an aspect ratio between about 3.0 and about 4.0.

5. The method according to claim 1 wherein said plasma-enhanced chemical vapor deposition (PECVD) process is performed at a temperature of about 440° C. to about 520° C.

6. The method according to claim 1 wherein a ratio of a thickness of said oxide layer deposited on the bottom of said trench structure to a thickness of said oxide layer deposited on the sidewall of said trench structure is between about 1.5 and about 2.3.

7. The method according to claim 1 wherein the step (c) is performed by a wet-etching process.

8. The method according to claim 7 wherein an etching selectivity of said oxide layer on the sidewall of said trench structure to said oxide layer on the bottom of said trench structure is between about 2.5 and about 3.

9. The method according to claim 1 wherein after the step (c), the steps of depositing and removing the oxide layer are repeated in sequence for allowing said bottom oxide layer to reach a required thickness.

10. The method according to claim 1 wherein said oxide layer comprises a silicon oxide layer.

11. The method of claim 1 wherein the deposited oxide layer has a ratio of thickness on the bottom of the trench to thickness on the sidewall of the trench of higher than about 1.5.

12. The method of claim 11 wherein the deposited oxide layer has a ratio of thickness on the bottom of the trench to thickness on the sidewall of the trench of lower than about 2.3.

13. A method of fabricating a trench-type power MOSFET, the method comprising:
   (a) providing a semiconductor substrate and forming a trench structure on the semiconductor substrate;
   (b) performing a plasma-enhanced chemical vapor deposition (PECVD) process without bias sputtering, with tetraethylorthosilicate (TEOS) as a gas source at a temperature of about 440° C. to about 520° C. to deposit an oxide layer on the bottom and sidewall of said trench structure and said semiconductor substrate, the oxide layer only partially filling the trench;
   (c) removing, using a single etching process, said oxide layer on the sidewall of said trench structure substantially completely and said oxide layer on the bottom of said trench structure partially to define the remaining oxide layer as a bottom oxide layer; and
   (d) forming the trench-type power MOSFET device in said trench structure.

14. The method according to claim 13 wherein the step (a) further comprises steps of:
   (a1) forming a pad oxide layer on said semiconductor substrate;
   (a2) forming a silicon nitride layer on said pad oxide layer; and
   (a3) removing said silicon nitride layer, said pad oxide layer and said semiconductor substrate partially to form said trench structure.

15. The method according to claim 14 wherein the step (a3) is performed by a photolithography and dry-etching process.

16. The method according to claim 13 wherein said trench structure has an aspect ratio between about 3.0 and about 4.0.

17. The method according to claim 13 wherein said plasma-enhanced chemical vapor deposition (PECVD) process is performed at a temperature of about 440° C. to about 520° C.

18. The method according to claim 13 wherein a ratio of a thickness of said oxide layer deposited on the bottom of said trench structure to a thickness of said oxide layer deposited on the sidewall of said trench structure is between about 1.5 and about 2.3.

19. The method according to claim 13 wherein the step (c) is performed by a wet-etching process.

20. The method according to claim 19 wherein the etching selectivity of said oxide layer on the sidewall of said trench structure to said oxide layer on the bottom of said trench structure is between about 2.5 and about 3.

21. The method according to claim 13 wherein between the steps of (c) and (d), the steps of depositing and removing said oxide layer are repeated for allowing said bottom oxide layer to reach a required thickness.

22. The method according to claim 13 wherein said oxide layer comprises a silicon oxide layer.

23. A method of forming a bottom oxide layer in a trench structure, the method comprising:
   providing a substrate including a trench having a bottom and a sidewall;

depositing an oxide layer on the bottom and sidewall of said trench by plasma-enhanced chemical vapor deposition (PECVD) process without bias sputtering, with tetraethylorthosilicate (TEOS) as a gas source at a temperature of about 440° C. to about 520° C., the oxide layer only partially filling the trench; and removing, using a single etching process, said oxide layer on the sidewall of said trench substantially completely and said oxide layer on the bottom of said trench partially to form a remaining oxide layer as the bottom oxide layer on the bottom of said trench.

24. The method of claim 23 wherein said oxide layer is removed by a wet-etching process having a higher etching selectivity of said oxide layer on the sidewall of said trench to said oxide layer on the bottom of said trench.

25. The method of claim 24 wherein the etching selectivity of said oxide layer on the sidewall of said trench to said oxide layer on the bottom of said trench is between about 2.5 and about 3.

* * * * *